(12) United States Patent
Lin et al.

(10) Patent No.: US 6,911,374 B2
(45) Date of Patent: Jun. 28, 2005

(54) FABRICATION METHOD FOR SHALLOW TRENCH ISOLATION REGION

(75) Inventors: Chin Hsiang Lin, Nantou (TW); Chin-Wei Liao, Nantou (TW); Hsueh-Hao Shih, Hsinchu (TW); Kuang-Chao Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 146 days.

(21) Appl. No.: 10/604,615

(22) Filed: Aug. 5, 2003

(65) Prior Publication Data

US 2004/0203216 A1 Oct. 14, 2004

(30) Foreign Application Priority Data

Apr. 11, 2003 (TW) ........................................ 92108333 A

(51) Int. Cl.[7] ........................ H01L 21/76; H01L 21/31; H01L 21/469
(52) U.S. Cl. ...................... 438/424; 438/427; 438/433; 438/434; 438/435; 438/437; 438/766
(58) Field of Search .................................. 438/424, 427, 438/433, 434, 435, 437, FOR 117, 766

(56) References Cited

U.S. PATENT DOCUMENTS

| 5,401,998 A | * | 3/1995 | Chiu et al. ................... 257/368 |
| 2002/0100952 A1 | * | 8/2002 | Hong ........................... 257/510 |
| 2003/0143789 A1 | * | 7/2003 | Su et al. ........................ 438/197 |

\* cited by examiner

Primary Examiner—David E. Graybill
(74) Attorney, Agent, or Firm—Jiang Chyun IP office

(57) ABSTRACT

A fabrication method for a shallow trench isolation region is described. A part of the trench is filled with a first insulation layer, followed by performing a surface treatment process to form a surface treated layer on the surface of a part of the first insulation layer. The surface treated layer is then removed, followed by forming a second insulation layer on the first insulation layer and filling the trench to form a shallow trench isolation region. Since a part of the trench is first filled with the first insulation layer, followed by removing a portion of the first insulation layer, the aspect ratio of the trench is lower before the filling of the second insulation in the trench. The adverse result, such as, void formation in the shallow trench isolation region due to a high aspect ratio, is thus prevented.

20 Claims, 3 Drawing Sheets

FABRICATION METHOD FOR SHALLOW TRENCH ISOLATION REGION

CROSS REFERENCE TO RELATED APPLICATIONS

This application claims the priority benefit of Taiwan application serial no. 92108333, filed on Apr. 11, 2003.

BACKGROUND OF INVENTION

1. Field of Invention

The present invention relates to a fabrication method for a shallow trench isolation region. More particularly, the present invention relates to a method for preventing void generation in a shallow trench isolation region.

2. Description of Related Art

The shallow trench isolation technique typically employs anisotropic etching to form a trench in a semiconductor substrate and filling an oxide material in the trench thereafter to form an isolation region for a device. The dimension of an isolation region formed by the shallow trench isolation technique can be adjusted. Further, the problem of bird's beak resulted in the conventional LOCOS is prevented. Therefore, shallow trench isolation is a preferred isolation technique in the sub-micron metal oxide semiconductor process.

Along with the increase of the integration of integrated circuits, the device dimension also gradually decreases. As the dimension of a shallow trench isolation region is being reduced when the integration of integrated circuits increases, problems that are associated with a high aspect ratio, for example, an incomplete filling of the trench or void generation in the subsequently formed shallow trench isolation region, will eventually surface. The isolation capability of a shallow trench isolation region would become inferior, leading to problems, such as, current leakage and undesirable reliability of the device.

SUMMARY OF INVENTION

Accordingly, the present invention provides a fabrication method for a shallow trench isolation structure, wherein the generation of voids in the shallow trench isolation structure is avoided to prevent poor isolation capability in the shallow trench isolation structure.

The present invention further provides a trench filling method, wherein the problem of an incomplete filling of the trench due to a high aspect ratio after the miniaturization of device is resolved.

The present invention provides a fabrication method for a shallow trench isolation region. This method comprises forming a mask layer over a substrate. Using the mask layer as an etching mask, the substrate is patterned to form a trench, wherein the trench comprises a first aspect ratio. A portion of the trench is filled with a first insulation layer, wherein the trench filled with the first insulation layer comprises a second aspect ratio, wherein the second aspect ratio is equal or smaller than the first aspect ratio. A first surface treatment process is performed to form a treated layer on the surface and sidewall of a part of the first insulation layer. In the present invention, the surface treatment process includes a tilted ion implantation process. Thereafter, a wet etching process is performed to remove the surface treated layer on the surface and sidewall of the first insulation layer. Further, the trench depth, after the removal of the treated layer, is substantially the same as that before the removal of the treated layer. However, the trench width, after the removal of the treated layer, is greater than that before the removal of the treated layer. Therefore, after the removal of the treated layer, the trench comprises a third aspect ratio, wherein the third aspect ratio is smaller than the second aspect ratio. Thereafter, a second insulation layer is formed over the first insulation layer, filling the trench. The mask layer is subsequently removed to form a shallow trench isolation region.

The present invention also provides a trench filling method, wherein this method provides a substrate having an opening already formed therein. The opening comprises a first aspect ratio. A portion of the opening is filled with a first material layer, wherein after filling with the first material layer, the opening comprises a second aspect ratio. Further, the second aspect ratio is equal or smaller than the first aspect ratio. Thereafter, a treated layer is formed on the surface of a part of the first material layer. In the present invention, the treatment process is, for example, a tilted ion implantation process. A wet etching process is then performed to remove the surface treated layer. The depth of the opening is substantially the same before and after the removal of the treated layer. However, the width of the opening, after the removal of the treated layer, is wider than the width of the opening before the removal of the treated layer. Therefore, subsequent to the removal the treated layer, the opening comprises a third aspect ratio. Further, the third aspect ratio is smaller than the second aspect ratio. Thereafter, a second material layer is formed over the first material layer to fill the opening.

In accordance to the present invention, filling a portion of the opening with a first material layer followed by removing a portion of the first material layer can lower the aspect ratio of the opening. Therefore, the present invention can mitigate the problem of an incomplete trench filling due to a high aspect ratio.

The fabrication method for a shallow trench isolation region further prevents the generation of voids. Therefore, the shallow trench isolation region formed provides a more desirable isolation effect.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 1A to 1G are schematic, cross-sectional views illustrating the process flow for fabricating a shallow trench isolation region according to one aspect of the present invention.

Figure 1A:
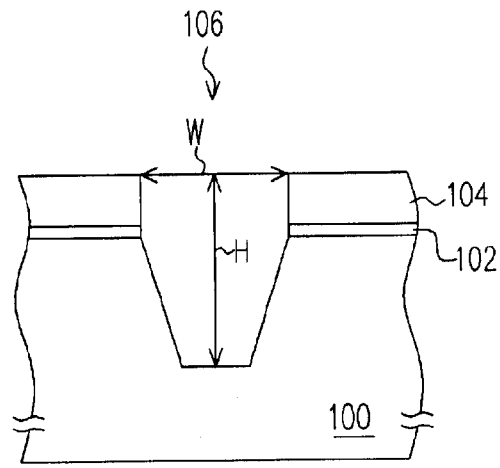
FIGS. 1A to 1G are schematic, cross-sectional views illustrating the process flow for fabricating a shallow trench isolation region according to one aspect of the present invention.

Referring to FIG. 1A, a pad oxide layer 102 and a mask layer 104 are formed over a substrate 100. The pad oxide layer 102 and the mask layer 104 are formed by, for example, performing a thermal oxidation process to form a thin oxide layer (not shown) on a surface of the substrate 100, followed by depositing a silicon nitride layer on the thin oxide layer and performing photolithography and etching to pattern the silicon nitride layer to form the mask layer 104. Further using the mask layer 104 as an etching mask, an etching process is performed to pattern the thin oxide layer and the substrate 100 to form the pad oxide layer 102 and a trench 106. The trench 106 comprises a depth "H" and a width "W". The aspect ratio of the trench 106 is "H/W".

Figure 1B:
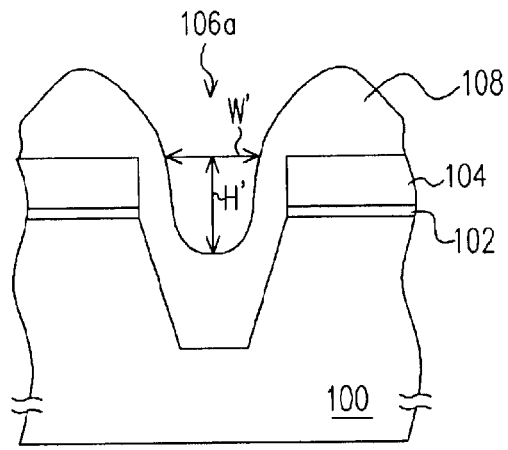

Referring to FIG. 1B, an insulation layer 108 is formed over the substrate 100, wherein the insulation layer 108 partially fills the trench 106. The thickness of insulation layer 108 is about 20% to 30% of the depth of the trench 106. The trench that is subsequent to the filling of the insulation layer 108 is depicted with the reference number 106a, wherein the trench 106a has a height "H'", a width "W'" and an aspect ratio "H"/W"". Further, the aspect ratio "H"/W"" of the trench 106a is smaller than the aspect ratio "H/W" of the trench 106. In one aspect of the present invention, the insulation layer 108 is formed with a material that includes silicon oxide. Further, The insulation layer 108 is formed by a method, such as, chemical vapor deposition, and preferably, a high density plasma chemical vapor deposition method.

Figure 1C:
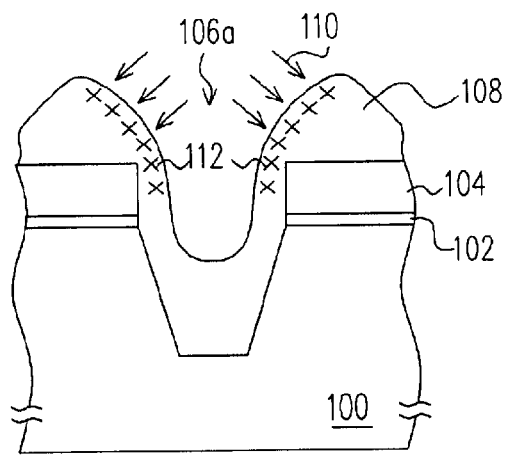

Continuing to FIG. 1C, a surface treatment step 110 is performed to form a treated layer 112 on the surface of the insulation layer 108. The surface treatment step 110 includes, for example, a tilted ion implantation process. Further, the tilted ion implantation process is conducted at an angle of about 30 degrees to about 60 degrees. The dopants used in the tilted ion implantation process comprise, for example, an nitrogen gas, an argon gas or other inert gas. In addition, the tilted angle ion implantation process is conducted at an energy level of about 20 KeV to about 100 KeV with a dopant concentration of about $1E15/cm^2$ to about $1E16/cm^2$.

Since the implanted angle in the above surface treatment process 110 is about 30 degrees to about 60 degrees, only a portion of the surface of the insulation layer 108 is implanted with dopants to form a treated layer 112. Further, the treated layer 112 and the insulation layer 108 have different etching rates. If the dopants used in the above tilted ion implantation process is nitrogen, the etching rate of the treated layer 112 is about 155 to 165 angstroms/minute. If the dopants used in the above tilted ion implantation process is argon, the etching rate of the treated layer 112 is about 195 to 205 angstroms/minute, whereas the etching rate of the insulation layer 108 without any implanted dopants is about 120 to 125 angstroms/minute.

Figure 1D:
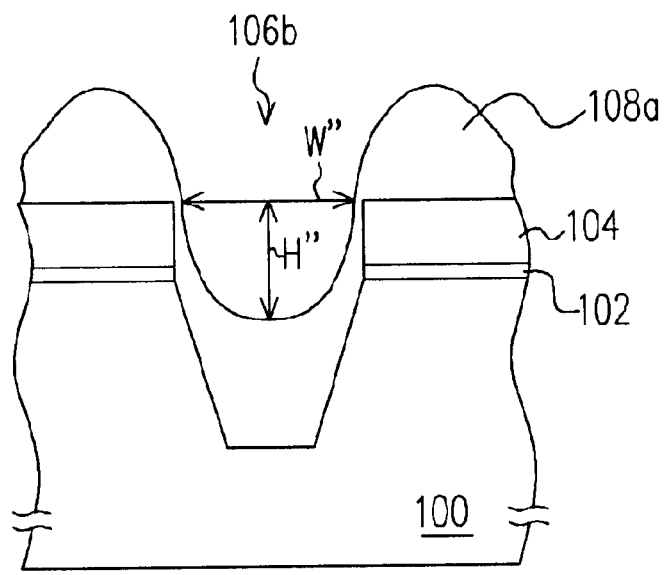

Referring to FIG. 1D, an etching, preferably a wet etching process, is performed to remove the treated layer 112 on the surface of the insulation layer 108. The trench, after the removal of the treated layer 112, is designated with the reference number 106b. The trench 106b has a depth "H'"", a width "W'"?, and an aspect ratio "H"/W"". One point that is worth noting is that the depth "H'"" of the trench 106b is substantially the same as the depth "H'"" of the trench 106a. However, the width "W'"" of the trench 106b is greater than the width "W'"" of the trench 106a. In other words, there is no significant change in the depth of the trench before and after the removal of the treated layer 112. However, after the removal of the treated layer 112, the width of the trench is increased. Therefore, the aspect ratio "H"/W"" of the trench 106b is smaller than the aspect ratio "H"/W"" of the trench 106a. As a result, to fill the trench 106b with an insulation material, the trench 106b can be filled completely.

Figure 1E:
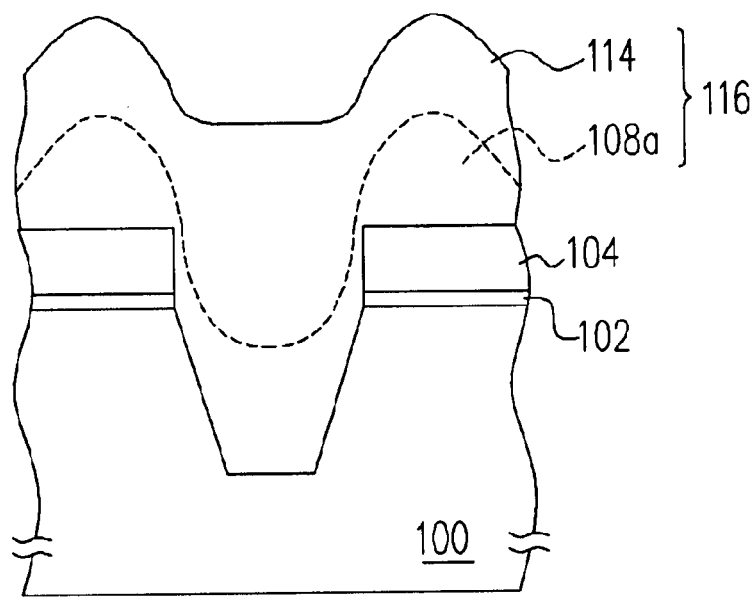

Referring to FIG. 1E, a insulation layer 114 is formed filling the trench 106b, wherein the insulation layer 108a and the insulation layer 114 together serve as an insulation material layer 116 for the shallow trench isolation region. In this aspect of the present invention, the insulation layer 114 is, for example, silicon oxide. Further, forming the insulation layer 114 includes, for example, performing chemical vapor deposition, and preferably, high density plasma chemical vapor deposition.

As discussed in the above, the aspect ratio "H"/W"" of the trench 106b is significantly reduced compared to the aspect ratio "H"/W"" of the trench 106a. Therefore, in accordance to the fabrication method of the present invention, the trench can be completely filled with the insulation material layer 116 without the formation of voids therein.

Figure 1F:
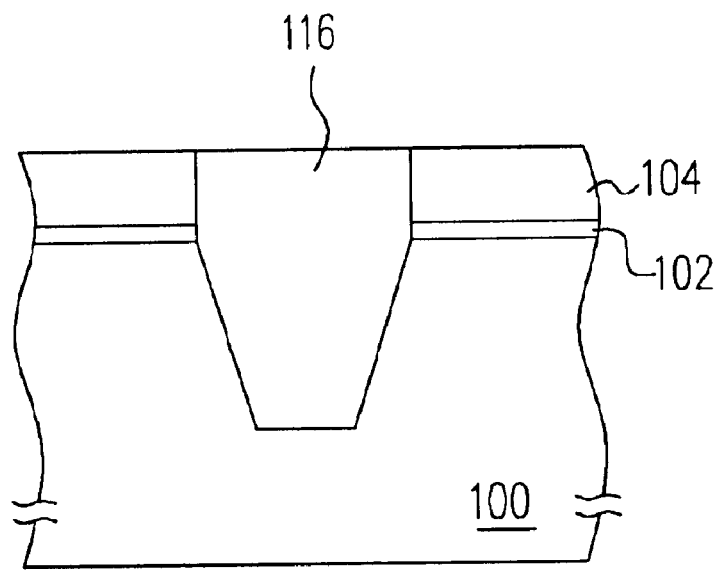

As shown in FIG. 1F, the insulation material layer 116 is partially removed until the mask layer 104 is exposed. Removing a portion of the insulation layer 116 includes performing chemical mechanical polishing or etching back.

Figure 1G:
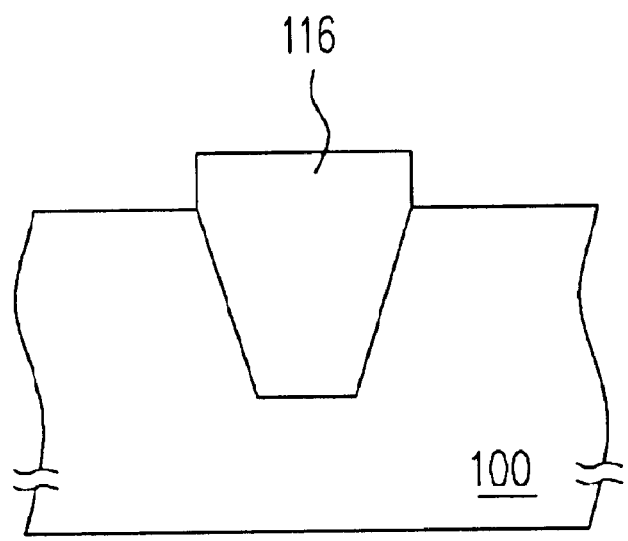

As shown in FIG. 1G, the mask layer 104 and the pad oxide layer 102 are removed to complete the fabrication of a shallow trench isolation region.

The fabrication method for a shallow trench isolation region of the present invention comprises filling a part of the trench of the first insulation layer, followed by removing a portion of the first insulation layer to lower the aspect ratio of the trench. The trench is then completely filled. Therefore, in accordance to the present invention, the trench can be completely filled without the formation of voids. The shallow trench isolation region can thus provide a superior isolation capability.

By improving the trench filling effect of the insulation material during the fabrication of a shallow trench isolation region of the present invention, the generation of voids in the isolation region is effectively prevented. Therefore, to lower the aspect ratio of an opening by filling a material layer into a part of the opening followed by removing a portion of the material layer can be applied to other filling processes, other than the shallow trench isolation process, for example, the filling process with an organic material or a metal material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a shallow trench isolation region, the method comprising:

forming a mask layer over a substrate;

patterning the substrate to form a trench using the mask layer as an etching mask;

filling partially the trench with a first insulation layer;

performing a surface treatment process to form a treated layer on a surface of a part of the first insulation layer;

removing the surface treated layer;

forming a second insulation layer on the first insulation layer and filling the trench; and removing the mask layer to form a shallow trench isolation region.

2. The method of claim 1, wherein the trench comprises a first aspect ratio, and the trench that is partially filled with the first insulation layer comprises a second aspect ratio, and the second aspect ratio is equal or smaller than the first aspect ratio.

3. The method of claim 1, wherein a width of the trench after the removing of the treated layer is greater than the width of the trench before the removing of the treated layer.

4. The method of claim 1, wherein a depth of the trench is substantially the same before and after the removing of the treated layer.

5. The method of claim 1, wherein the surface treatment process includes a tilted ion implantation process.

6. The method of claim 5, wherein the tilted ion implantation process is conducted at an angle of about 30 degrees to about 60 degrees.

7. The method of claim 5, wherein a dopant used in the tilted ion implantation process includes a nitrogen gas, an argon gas or other inert gases.

8. The method of claim 5, wherein an energy level for the tilted ion implantation process is between 20 KeV to 100 KeV.

9. The method of claim 5, wherein a dopant concentration for the tilted ion implantation process is about $1E15/cm^2$ to about $1E16/cm^2$.

10. The method of claim 1, wherein the removing of the surface treated layer includes performing a wet etching process.

11. The method of claim 1, wherein forming the first insulation layer and the second insulation layer includes performing a high density plasma chemical vapor deposition method.

12. A trench filling method, comprising:

providing a substrate, wherein an opening is formed in the substrate;

filling a portion of the opening with a first material layer;

performing a surface treatment step to form a treated layer on a sidewall surface of the first material layer;

removing the treated layer; and forming a second material layer on the first material layer and filling the opening.

13. The method of claim 12, wherein the opening comprises a first aspect ratio before filling the opening with the first material layer, and the opening comprises a second aspect ratio after filling the opening with the second material layer.

14. The method of claim 12, wherein a width of the opening after the removing of the treated layer is greater than the width of the opening before the removing of the treated layer.

15. The method of claim 12, wherein a depth of the opening after the removal of the treated layer is substantially the same as the depth of the opening before the removing of the treated layer.

16. The method of claim 12, wherein the surface treated step includes a tilted ion implantation step.

17. The method of claim 16, wherein the tilted ion implantation is conducted at angle of about 30 degrees to about 60 degrees.

18. The method of claim 16, wherein a dopant used in the tilted ion implantation process includes an nitrogen gas, an argon gas or other inert gas.

19. The method of claim 16, wherein an energy level in the tilted ion implantation process is about 20 KeV to about 100 KeV.

20. The method of claim 16, wherein a dopant concentration for the tilted ion implantation process is about $1E15/cm^2$ to about $1E16/cm^2$.

* * * * *